(12) United States Patent
Rose

(10) Patent No.: US 6,184,674 B1
(45) Date of Patent: Feb. 6, 2001

(54) INDICATING INSTRUMENT WITH MIGRATION BARRIERS

(76) Inventor: Vincent H. Rose, P.O. Box 559, Powell, WY (US) 82435

(*) Notice: Under 35 U.S.C. 154(b), the term of this patent shall be extended for 0 days.

(21) Appl. No.: 09/146,741

(22) Filed: Sep. 3, 1998

Related U.S. Application Data

(63) Continuation-in-part of application No. 08/770,562, filed on Dec. 20, 1996, now Pat. No. 5,854,552.

(51) Int. Cl.[7] .................................................. G01R 1/20
(52) U.S. Cl. .................... 324/146; 324/125; 324/114; 324/143; 73/732
(58) Field of Search ................................... 324/114, 125, 324/115, 143, 144, 146, 157 A, 154 R; 336/180; 73/732, 735

(56) References Cited

U.S. PATENT DOCUMENTS

| | | | |
|---|---|---|---|
| 2,323,732 | 7/1943 | Smith | 324/114 |
| 3,494,203 | 2/1970 | Efimenko et al. | 324/125 |
| 3,778,711 | 12/1973 | Samuel | 324/125 |
| 4,402,335 | 9/1983 | Kemmler | 137/82 |
| 4,492,920 | 1/1985 | Reenstra | 324/146 |
| 4,724,601 | 2/1988 | MacManus et al. | 324/146 |
| 4,906,919 | 3/1990 | Sato et al. | 324/143 |
| 5,017,862 | 5/1991 | Brooks | 324/145 |
| 5,038,099 | 8/1991 | Markow et al. | 324/143 |
| 5,095,266 | 3/1992 | Ohike et al. | 324/146 |

*Primary Examiner*—Jay Patidar
(74) *Attorney, Agent, or Firm*—Dorsey & Whitney LLP

(57) ABSTRACT

Moving magnet indicating instruments in which a damping fluid migration barrier projects from the inside of one wall of the bobbin coil and another damping fluid migration barrier projects from the face of the rotor which confronts that wall. Certain fluids have a tendency to migrate, or "creep," over surfaces they contact. The fluid migration barriers of the present invention prevent unwanted migration of fluid out of a cavity by providing a sharp peak over which the fluid cannot creep.

21 Claims, 7 Drawing Sheets

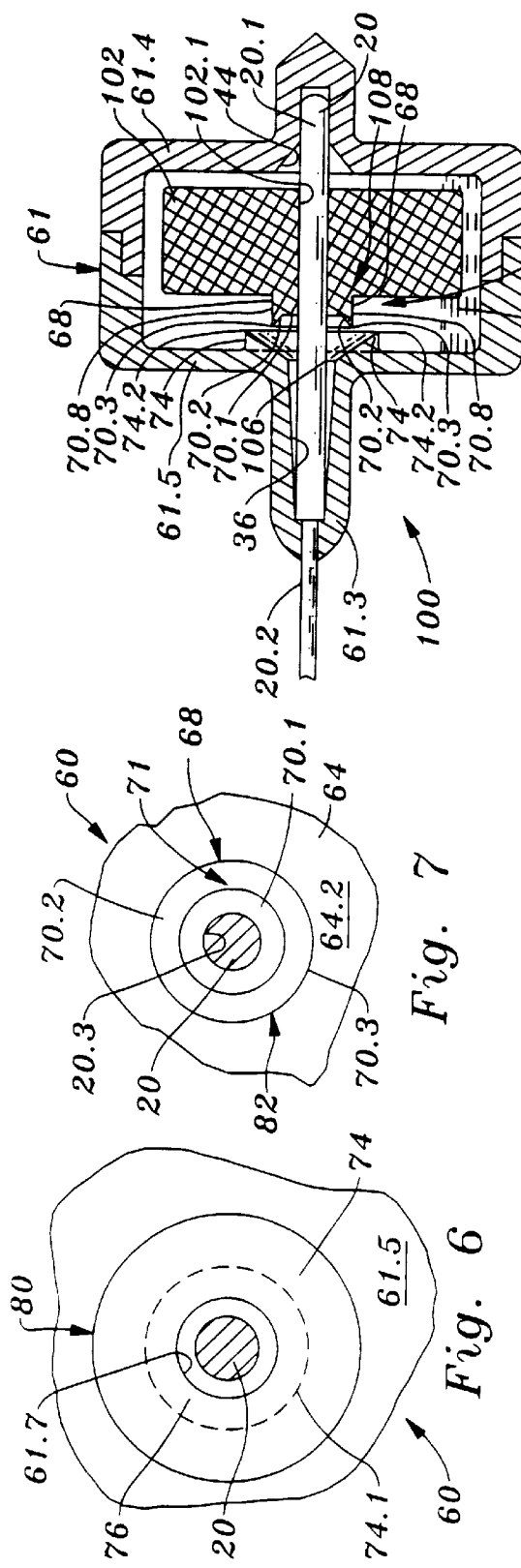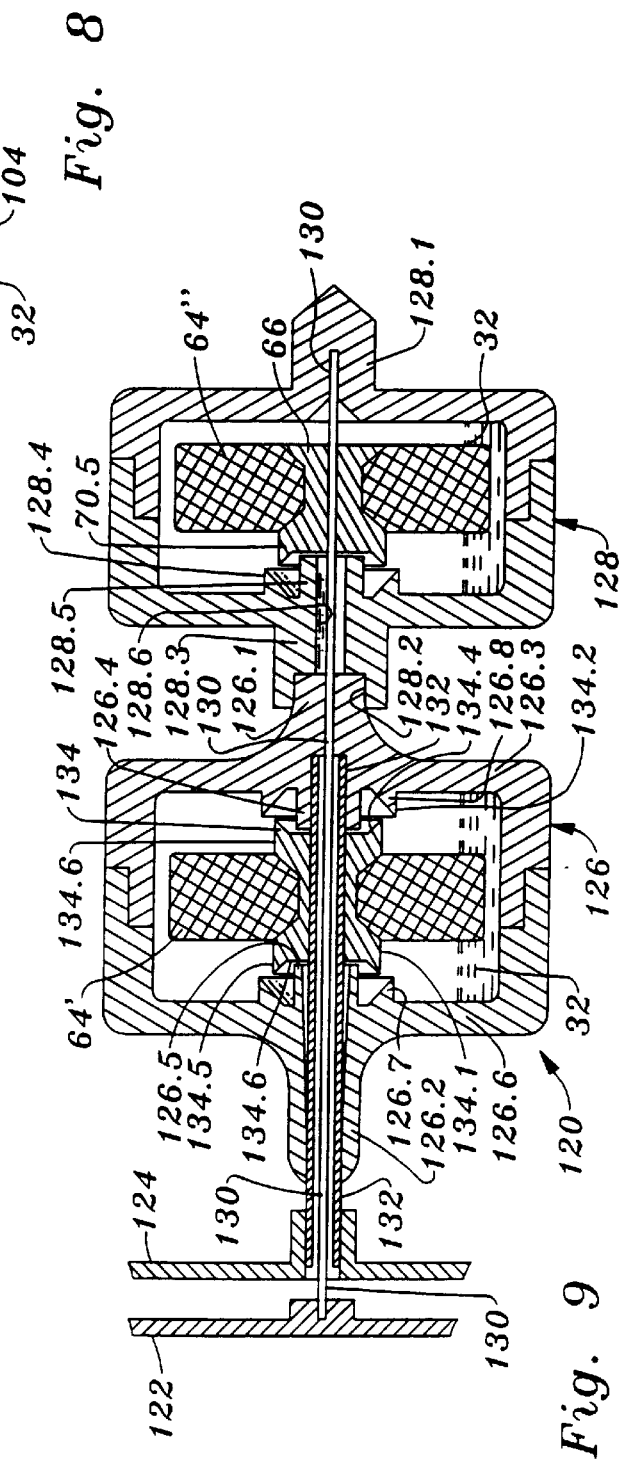

INDICATING INSTRUMENT WITH MIGRATION BARRIERS

This application is a continuation-in-part application based on Ser. No. 08/770,562, which was filed as "Moving Magnet Indicating Instruments" on Dec. 20, 1996, now U.S. Pat. No. 5,854,552, and was allowed on Mar. 17, 1998.

BACKGROUND OF THE INVENTION

1. Field of the Invention

My present invention relates to indicating instruments, and more particularly to indicating instruments of the moving magnet type wherein a magnet is mounted on a shaft carrying a pointer one end of which is closely juxtaposed to a dial, and wherein an environing magnetic field is provided in the space provided by the shaft-mounted magnet and the direction of that magnetic field is varied in accordance with the momentary magnitude of a parameter whose magnitude is to be indicated on the dial by the pointer.

The present invention also relates to an apparatus for preventing the unwanted migration of fluid out of a chamber, including a chamber used to hold damping fluid in an indicating instrument, such as a moving-magnet or Bourdon-tube indicating instrument.

2. Description of the Prior Art

Moving magnet indicating instruments are well known in the prior art.

For example, a moving magnet indicating instrument of the cross-coil type is shown and described in U.S. Pat. No. 5,095,266, which was issued to Yukio Ohike and Tomohiro Sugiyama on Mar. 10, 1992. In the indicating instrument of this patent the magnetic field which environs the moving magnet is provided by electrical currents flowing through a pair of mutually perpendicular coils, said currents varying from moment to moment in accordance with the momentary magnitude of the quantity to be indicated.

Another moving magnetic indicating instrument of the cross-coil type is shown and described in U.S. Pat. No. 4,906,919, which was issued to Koichi Sato, Tatsuro Togawa and Toshiyuki Ohtake on Mar. 6, 1990.

Another type of moving magnet indicating instrument known in the prior art is typified by the differential pressure and flow instruments made and sold by Orange Research, Inc., of 140 Cascade Boulevard, Milford, Conn. 06460. In these instruments the magnetic field which environs the moving magnet, and which moves the pointer shaft and its associated dial pointer, is a permanent magnet which is moved with respect to the dial operating magnet by the fluid pressure or fluid flow the magnitude of which is to be indicated.

As is well known to those having ordinary skill in the moving magnet indicating instrument art, the moving magnet assemblies of such instruments, principally comprising the moving magnet, the shaft, and the dial pointer thereof, are characterized by low inertia and low friction, necessitating the provision of damping means. Further, due to the highly competitive economics of manufacturing and marketing of these instruments, such damping means must be as inexpensive and simple to assemble as possible. This requirement as led to the widespread adoption for this purpose of a small quantity of suitable damping fluid, such as silicone oil, disposed in the cavity formed by the housing of the instrument, containing the moving magnet, with no containment means to positively maintain the damping fluid within the housing.

Unfortunately, as is well known to those having ordinary skill in the art, there is a definite tendency for the damping fluid to migrate, via the clearance between the dial shaft and the surrounding portion of the instrument housing, to parts of the instrument where its presence is undesirable, such as the pointer, the dial face, and the lens of the instrument. Indeed, this is a problem with all indicating instruments that use damping fluids, including mechanical indicating instruments such as Bourdon tube indicating instruments.

Additionally, many of the prior art moving magnet indicating instruments are provided with pointer shafts which are of very small diameter, as compared with their overall length.

While the use of such small diameter pointer shafts saves weight and cost, it results in certain disadvantages, such as the inadvertent binding of the shaft, and the lack of sufficient contact surface area between the shaft and the wall of the central hole in the moving magnet, into which the shaft is press-fitted. Further, the small diameter of the pointer shaft severely limits the area of the shoulder turned therein which is used as part of the thrust bearing which prevents movement of the shaft into and out of the opening in the housing in which its pointer-bearing end is journaled.

It is believed that the documents listed immediately below contain information which is or might be considered to be material to the examination of this patent application.

U.S. Pat. Nos. 3,494,203, 3,778,711, 4,402,335, 4,492,920, 4,724,601, 5,017,862, 5,038,099

The term "prior art" as used herein or in any statement made by or on behalf of applicant means only that any document or thing referred to as prior art bears, directly or inferentially, a date which is earlier than the effective filing date hereof.

No representation or admission is made that any of the above-listed or cited documents is part of the prior art, or that a search has been made, or that no more pertinent information exists.

A copy of each of the above-listed or cited documents is being supplied to the United States Patent and Trademark Office herewith.

SUMMARY OF THE INVENTION

Accordingly, it is an object of my present invention to provide leak preventing means for preventing the leakage of silicone damping oil from inside the housings of moving magnet indicating instruments, through the pointer-shaft-receiving holes in said housings.

It is another object of my present invention to provide leak preventing means which achieve the foregoing object and can be added to a wide range of prior art moving magnet indicating instruments with very little or no extra manufacturing costs.

It is another object of my present invention to provide fluid migration barriers to prevent leaking of fluid from any indicating instrument, including both moving magnet indicating instruments and mechanical indicating instruments, such as Bourdon tube indicating instruments.

It is a further object of my present invention to provide fluid migration barriers to prevent the unwanted migration of a fluid out of any cavity, wherein the fluid has a tendency to migrate over a surface.

It is yet another object of my present invention to provide double-faced moving magnet indicating instruments having first and second dial faces, one on each side of the instrument, in which both dial-carrying sides are provided with leak preventing means which prevents the leakage of damping oil from the housings of said instruments through either of said dial shaft holes.

It is a further object of my present invention to provide double-pointer moving magnet indicating instruments each of which instruments has a single dial face with which two different pointers coact, each pointer indicating, on an associated scale on said dial face, the magnitude of a different input signal or measured quantity. Said dial face may, in some embodiments, bear a single scale or two superimposed scales.

Other objects of my present invention will in part be obvious and will in part appear hereinafter.

My present invention, accordingly, comprises the apparatus embodying features of construction, combinations of elements, and arrangements of parts, all as exemplified in the following disclosure, and the scope of my present invention will be indicated in the claims appended hereto.

In accordance with a principal feature of my present invention moving magnet indicating instruments which contain damping fluid are provided with one or more migration barriers by means of which migration of the damping fluid over the inside surfaces of the housing of said instrument, and over the surfaces of the parts contained in said housing, are prevented.

In accordance with another principal feature of my present invention each of said migration barriers is a ridge which is raised on the inner surface of the instrument housing, or on the surface of a part contained therein.

In accordance with yet another principal feature of my present invention each of the ridges of certain embodiments of my invention are of toroidal configuration and of generally triangular cross-section.

In accordance with a further principal feature of my present invention the part of each such ridge which is most remote from the supporting part of said housing or part contained therein is a linear peak, which is linear in the sense that it has substantially no face area, but rather is a sharp edge.

In accordance with a yet further principal feature of my present invention certain ones of said migration barriers have a cylindrical outer surface and a frustoconical inner surface.

In accordance with another principal feature of my present invention certain instruments of the invention are provided with two migration barriers, both of which migration barriers are generally toroidal in form, and both of which surround the pointer shaft of the instrument.

In accordance with yet another principal feature of my present invention, in certain instruments thereof, one of said ridges is raised upon the inner surface of the instrument housing through which the pointer shaft passes, and another ridge is raised upon the face of the instrument rotor confronting that inner wall.

In accordance with a further principal feature of my present invention the ridges contained in an instrument thereof confront each other with the frustoconical faces of the ridges opposing each other.

In accordance with another principal feature of my present invention, a fluid migration barrier system is provided for preventing the migration of a fluid out of a chamber. The fluid migration barrier system comprises: (1) a housing defining a chamber, wherein the chamber has at least a first opening defined by a first perimeter edge of the housing and a closed end substantially opposite the first opening, and wherein an axis is defined between the center of the first opening and the center of the closed end; (2) a fluid disposed in the chamber; and (3) a first ridge on the housing surrounding the axis of the chamber, wherein the first ridge forms a first sharp edge having substantially no surface area, thereby discouraging the fluid in the chamber from migrating over the surface of the housing beyond the first ridge.

In accordance with another principal feature of my invention, migration barriers to prevent a fluid in a cavity from migrating into undesired areas are provided both inside and outside the cavity.

In accordance with another principal feature of my invention, migration barriers are provided to prevent the migration of damping fluid out of a chamber used to damp the rotation of a shaft and pointer connected to a mechanical measuring device, such as a Bourdon tube.

In accordance with a further principal feature of my invention, migration barriers are provided that may be used to prevent fluid migration out of any chamber, regardless of whether the chamber is part of an indicating instrument.

In accordance with a yet further principal feature of my present invention a moving magnet indicating instrument movement is comprised of two rotors, the pointer shaft of one rotor being hollow and containing the pointer shaft of the other rotor, and each pointer shaft is provided with a pointer, both of which pointers coact with a scale borne by a common indicating dial face.

In accordance with another principal feature of my present invention a moving magnet indicating instrument is provided with a pointer shaft which extends outwardly from opposite faces of the instrument housing, and two pointers are provided, one affixed to each end of said pointer shaft.

For a fuller understanding of the nature and objects of my present invention, reference should be had to the following detailed description, taken in connection with the accompanying drawings.

BRIEF DESCRIPTION OF THE DRAWINGS

FIGS. 5A, 5B, 6 and 7 are partial views of the moving magnet indicating instruments of the present invention shown in FIG. 5;

FIG. 8 is a cross-sectional view of a moving magnet indicating instrument of an alternative embodiment of the present invention;

FIG. 9 is a cross-sectional view of the embodiment of the present invention in which two pointers coact with a single dial face;

DESCRIPTION OF THE PREFERRED EMBODIMENTS

Figures 1, 2, 3:
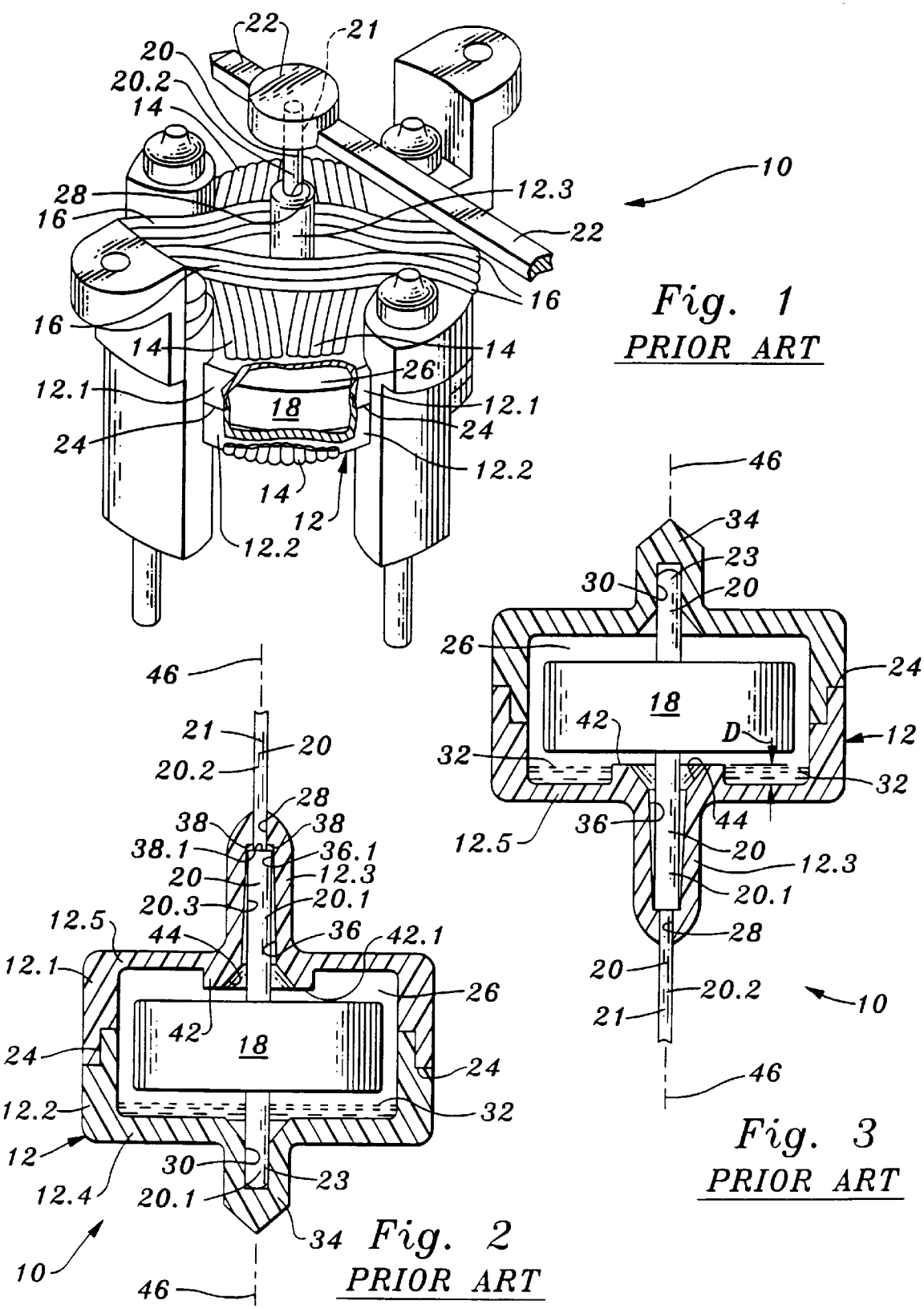
FIG. 1 is a perspective view of a typical moving magnet indicating instrument of the prior art.
FIGS. 2 through 4 are cross-sectional views of the moving magnet indicating instrument of the prior art shown in FIG. 1.

Referring now to FIG. 1, there is shown a partial perspective view of the movement 10 of a typical moving magnet indicating instrument of the prior art, and more particularly the movement of a moving magnet indicating instrument of the type sometimes known in the prior art as a "cross-coil" instrument.

As seen in FIG. 1, movement 10 is comprised of a coil bobbin 12 on which a pair of coils 14, 16 are mutually perpendicularly wound. A disc-shaped, or discate, permanent magnet rotor 18 with North and South poles induced therein is disposed within coils 14, 16 and inside of bobbin 12. Magnetic rotor 18 is provided with an elongated shaft 20 the axis of which is substantially coincident with the axis of symmetry of rotor 18 which is perpendicular to the planar faces of rotor 18. Pointer shaft 20 is rotatably supported by coil bobbin 12. A first or outer end 21 of shaft 20 projects outwardly from bobbin 12. A pointer 22 is secured to said first end 21 of shaft 20.

Referring again to FIG. 1, it will be seen that coil bobbin 12 is divided, along a parting line 24, into two coil bobbin sections 12.1, 12.2 which are adjacent to each other along shaft 20. The two coil bobbin sections, 12.1, 12.2, together define a chamber 26 in which rotor 18 is disposed. Upper coil bobbin section 12.1 is provided with a bearing aperture 28 through which said first end 21 of shaft 20 projects, and in which shaft end 21 is close-fittingly, rotatably received. Lower coil bobbin section 12.2 is provided with a well or bearing 30 (FIG. 2) which close-fittingly, rotatably receives the lower or inner end 23 of shaft 20, i.e., shaft 20 is journaled in well 30.

Thus, it will be understood by those having ordinary skill in the instrument art that shaft 20 and rotor 18 are jointly rotatably mounted in coil bobbin 12. As also seen in FIG. 1, bearing aperture 28 is formed in the outer end of a projection or "nose" 12.3 which projects outwardly from the main body portion of coil bobbin 12.

Referring now to FIG. 2, there is shown a partial, cross-sectional view of the instrument movement 10 shown in FIG. 1. As seen in FIG. 2, the smaller diameter portion 20.2 of shaft 20 is journaled in bearing aperture or bearing 28, and the larger diameter portion 20.1 of shaft 20 is rotatably received in well 30.

As also seen in FIG. 2, a predetermined quantity of damping fluid 32 is contained in chamber 26, and is drawn by gravity to the lower end thereof.

As further seen in FIG. 2, well 30 extends into a boss 34 which is formed integrally with and extends outwardly from the lower planar wall 12.4 of coil bobbin 12.

In the known manner, the larger diameter lower or main body portion 20.1 of shaft 20 passes through a tapered passage 36 of circular cross-section the small diameter end 36.1 of which is larger in diameter than bearing aperture or bearing 28.

Also in the known manner, a shoulder 38 is defined between the inner end of bearing 28 and the smaller, outer end 36.1 of tapered passage 36. Shoulder 38 cooperates with the shoulder 38.1 defined between shaft section 20.1 and shaft section 20.2 to limit the upward longitudinal movement of shaft 20. Downward movement of shaft 20, as seen in FIG. 2, is limited by contact between the lower end of shaft 20 and the bottom of well 30.

As also seen in FIG. 2, a boss 42 is raised on the inner face of upper planar wall 12.5 of coil bobbin 12, and a conical bell mouth 44, which communicates with tapered passage 36, is provided in boss 42 and in wall 12.5, in such manner that shaft 20 passes through conical bell mouth 44, and thus into the main part of chamber 26. (The interior of passage 36, including the space within bell mouth 44, is considered herein to be part of chamber 26.) In FIG. 3 there is shown instrument movement 10, inverted with respect to the orientation of movement 10 as shown in FIG. 2.

As shown in FIG. 3, the quantity of damping fluid 32 is so determined, as compared with the product of the depth D of boss 42 and the area of the inner face of wall 12.5 surrounding boss 42, that when movement 10 is fully inverted as seen in FIG. 3, i.e., disposed with nose 12.3 facing downward and boss 34 facing upward, the free surface of damping fluid 32 is lower than the planar outer face 42.1 of boss 42, and thus a minimum of damping fluid 32 enters conical bell mouth 44, and tapered passage 36.

Figure 4:
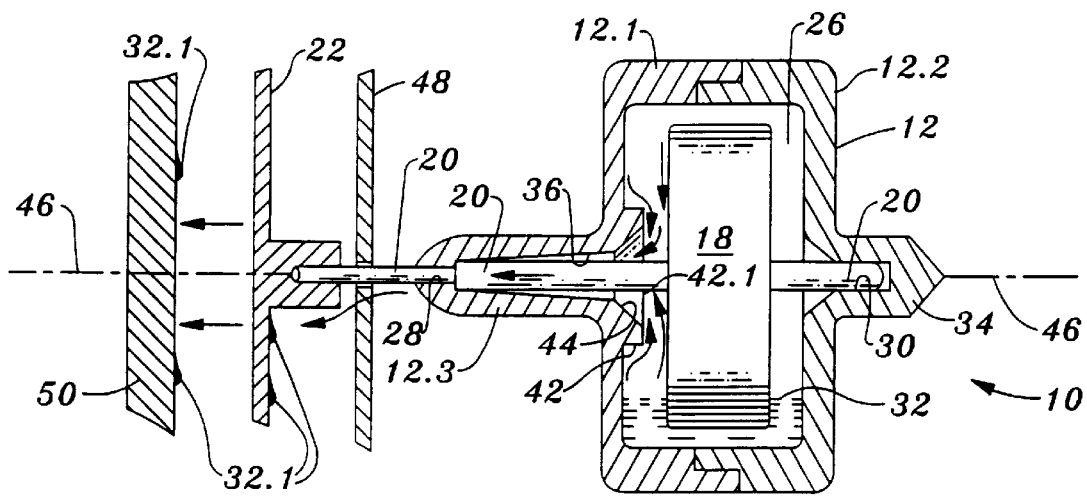

Referring now to FIG. 4, instrument movement 10 is shown in its most common operating attitude, viz., with its axis 46 substantially horizontal. Also shown in FIG. 4 (in part) are the dial face 48 and the lens 50 of the instrument of which movement 10 is a part.

As is well known to those having ordinary skill in the instrument art, moving magnet instruments or gauges, such as the moving magnet instrument or gauge of which movement 10 is a part, are commonly constructed and calibrated to indicate various parameters such as temperature, liquid level, pressure, vehicular speed, revolutions per minute or various electrical properties. Typically, such a moving magnet instrument or gauge consists of a movement having a shaft which is attached to a pointer and a dial or scale bearing marks which correspond to predetermined increments of the sensed parameter. The movement is arranged to receive a signal (electrical, pneumatic, hydraulic, etc.) representing a remotely sensed condition and to convert the momentary values of that signal to corresponding angular shaft deflections.

A common type of moving magnet indicating instrument or gauge movement, of which movement 10 is an example, is an "air core" movement, also sometimes called a "cross-coil" movement. A typical air core movement consists of two coils or sets of coils which are maintained perpendicular to each other by being wound over a two-part housing or coil bobbin which contains a magnetically orientable permanent magnet disc attached to a pointer shaft. The coils are electrically connected to a source of electrical signals which are functions of the successive momentary magnitudes or values of the sensed condition, and thus create a resultant magnetic field, the direction of the axis of which changes from moment to moment in accordance with magnitudes of the sensed condition. The magnetic disc follows the resultant magnetic field and rotates the shaft and pointer in turn. Indication of the sensed condition is thereby shown by the pointer position on the dial.

When in use, if the instrument is subjected to shock, vibration or sudden electrical variation, the pointer frequently responds with excessive movement and flutter. This is because the pointer-shaft-magnetic disc assembly has low inertia and low friction. This pointer shock and flutter is objectionable because it reduces the accuracy of the readings and also can permanently damage the instrument. A common way to overcome this difficulty is to add damping fluid to the cavity formed within the coil bobbin. The normal attitude of the instrument in operation is with its shaft substantially horizontal, the normal limit being 45 degrees off horizontal. When the instrument is in said normal operating position, the lower part of the magnetic disc dips into the silicone oil contained in the chamber formed within the coil bobbin. The viscous drag of the silicone oil on the magnetic disc resists sudden mechanical and electrical forces that formerly caused unwanted pointer flutter. The resultant pointer movement is a smooth representation of the sensed condition. The degree of damping can be varied by correspondingly varying the viscosity of the silicone oil selected for use in said chamber.

The two coil bobbin parts (e.g., 12.1, 12.2, FIG. 2) are fitted together tightly to prevent silicone oil leakage at their juncture 24. As noted above, shaft 20 extends through an aperture 28 in the nose 12.3 of the coil bobbin. This aperture normally serves as a front bearing journal for shaft 20. This aperture can also act as an unwanted channel whereby silicone oil inside the coil bobbin can escape to the outside of the coil bobbin. Leakage of silicone oil through this aperture is troublesome because the oil then often flows onto the pointer, changing its balance and cosmetics. Oil may also flow onto the lens of the instrument disturbing the optics and cosmetics of the lens, and the loss of oil within the coil bobbin reduces or eliminates the desired damping.

Use of an elastomeric seal between the pointer shaft and its associated bearing aperture is not practical because of the high friction drag of such a seal. Friction between the pointer shaft 20 and the coil bobbin must be very low, in order for the pointer to accurately respond to changes in the sensed condition.

In accordance with current manufacturing practices the leakage of such silicone oil damping fluid is minimized by so maintaining the instrument during the manufacturing process that the pointer shaft points vertically upward, and thus the pointer shaft bearing aperture is on the upper side of the instrument at all times during manufacturing.

When possible, it is arranged that the instrument be maintained in this same, pointer shaft upward, orientation until the instrument is mounted in the equipment it is intended to protect. However, it is not always possible to maintain this orientation of the instrument until it is mounted in its place of intended use, especially if the instrument is to be shipped in a carton to its place of installation. For this reason it is current practice to provide a small annular dam (42, FIGS. 2 and 3) on the inner face of the front (or upper) planar wall of the coil bobbin of the instrument (12.5, FIGS. 2 and 3) to prevent drainage of the silicone oil if the instrument is accidentally turned upside down.

This annular dam (42, FIGS. 2 and 3) does reduce damping fluid leakage to some extent, but it does not sufficiently reduce it to substantially completely eliminate the leakage problem.

As seen in FIG. 4, typical prior art instruments are sometimes adversely affected by silicone oil leaking (arrows) through bearing aperture 28, even when these instruments are never inverted ("nose" 12.3 pointed downward) throughout the manufacturing process and are mounted for use with their pointer shafts approximately horizontal. This leaking is caused by an undesirable property of the silicone oils used for damping, i.e., such silicone oils tend to wet surfaces they contact, and then spread along those surfaces. Because of this spreading tendency, a film of such a silicone oil will often migrate beyond annular dam 42 and into the shaft bearing aperture 28. This damping oil migration, over housing and/or shaft surfaces, toward bearing aperture 28 continues with time, finally reaching the journal surface 28. Silicone oil may completely fill the void between shaft 20 and the journal surface 28 of coil bobbin or housing 12. This results in a temporary oil seal, which isolates the atmosphere inside the coil bobbin from the outside atmosphere. Changes in ambient temperature or barometric pressure can then change relative pressures between the inside and the outside of the coil bobbin. When the pressure inside the coil bobbin becomes greater than that outside, additional pressure is placed on the damping oil, aiding its escape from the coil bobbin, and especially from the void between shaft 20 and journal surface 28. Sometimes, there is enough internal pressure to cause the silicone oil to splatter (32.1) onto the pointer and lens of the instrument (FIG. 4). This splattering of the silicone damping oil is a very serious matter because the instrument's purpose, to protect expensive machinery, is thus compromised.

Silicone oil is the preeminent choice for damping instrument gauges because of its many desirable properties, viz., chemical compatibility with most materials, chemical stability, insolubility by most common solvents, low evaporation, relatively constant viscosity over the normally encountered range of temperatures (minus 40 to plus 85 degrees Centigrade), and acceptable cost. The many advantages of silicone oil overshadow its undesirable property, i.e., its strong tendency to spread over the surfaces of solid bodies.

An alternative mode of damping is to provide a more viscous substance such as a grease or a combination of greases in the rear bearing journal (e.g., 30,2) of the instrument movement. While such a grease or combination of greases tends not to leak out of the coil bobbin, its use is limited because it is difficult for grease to provide medium to heavy damping which remains consistent for the intended life of the instrument.

Referring now to FIGS. 5, 5A, 5B, 6 and 7 there is shown a moving magnet indicating instrument movement 60 of the first preferred embodiment of my present invention.

Figure 5:
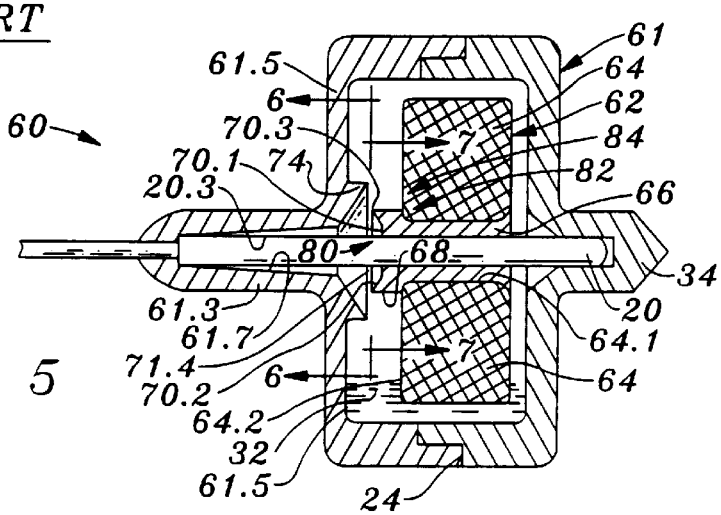
FIG. 5 is a cross-sectional view of a moving magnet indicating instrument of the present invention.

As will be understood by those having ordinary skill in the art, informed by the present disclosure, many structural aspects of movement 60 of FIG. 5 are substantially identical to the same structural aspects of the prior art movement 10 shown in FIGS. 1 through 3. Thus, for clarity of disclosure, structural aspects common to the prior art movement 10 (shown in FIGS. 1 through 4) and the movements of FIG. 5 or any subsequently numbered figure herein will be identified by the reference numeral used to designate that structural aspect in FIGS. 1 through 4.

For example, then, the coil bobbin shown in FIG. 5, which is in many ways but not in all ways substantially identical to coil bobbin 12 shown in FIGS. 1 through 4, will be designated in FIG. 5 by the previously unused reference numeral 61. On the other hand, the pointer shaft 20 shown in FIG. 5, which is substantially identical to the pointer shaft 20 shown in FIGS. 1 through 4, will be designated in FIG. 5 (and certain later-numbered figures of the drawings) by the reference numeral 20.

It will thus be understood from the above by those having ordinary skill in the instrument art, that only those parts or assemblies of movement 60 of the present invention (shown in FIG. 5) which are unique to my invention will be designated by reference numerals whose numerical valve is greater than 60.

Referring again to FIG. 5, it will be seen those having ordinary skill in the instrument art, informed by the present disclosure, that rotor 18 of FIGS. 1 through 4 is replaced in movement 60 by a composite rotor 62 which is comprised of a toroidal permanent magnet member 64 and a core 66. Toroidal permanent magnet member 64 is magnetized to provided a North magnetic pole and a South magnetic pole at the opposite ends of a diameter thereof. Core 66 is tightly affixed to both toroidal magnet 64 and shaft 20 by surface friction or by a suitable adhesive.

As also thus seen in FIG. 5, the pointer-adjacent end of core 66 is formed as a projection or boss 68 located immediately outside of core-receiving passage 64.1 which extends completely through toroidal magnetic member 64. Boss portion 68 surrounds shaft 20 and thus may be thought of as itself being toroidal in shape.

Further, as best seen by those having ordinary skill in the instrument art, informed by the present disclosure, by comparison of FIGS. 5 and 7, the outer face of boss 68 takes the form of a concavity 71.

As may also be seen by those having ordinary skill in the instrument art, informed by the present disclosure, by comparison of FIGS. 5 and 7, concavity 71 has a planar central bottom portion 70.1 and a frustoconical outer portion 70.2.

Figure 5A:
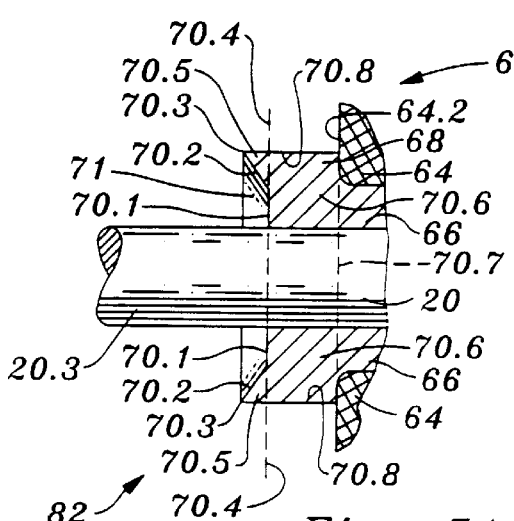

Referring now to FIG. 5A, and comparing it with FIGS. 5 and 7, it will be seen by those having ordinary skill in the instrument art, that boss 68 may be thought of as being comprised of a main body portion 70.6, which lies between the plane 70.4 of the planar central bottom face 70.1 of concavity 71 and the plane 70.7 of the outer face 64.2 of toroidal magnet 64, and further being comprised of a ridge 70.5 of generally triangular cross-section; ridge 70.5 being in fact integral with main body portion 70.6 of boss 68.

As also will be seen in FIG. 5A, ridge 70.5 is so shaped as to define a circular peak 70.3, which is the part of ridge 70.5 most remote from plane 70.4.

It is to be understood that in accordance with a principal feature of the present invention peak 70.3 is linear, i.e., has substantially no face area, but rather constitutes a sharp edge of boss 68, whereby it serves to prevent migration of silicone damping fluid from face 64.2 of toroidal magnet 64, or cylindrical outer face 70.8 of boss 68, to face 20.3 of shaft 20.

Figure 5B:
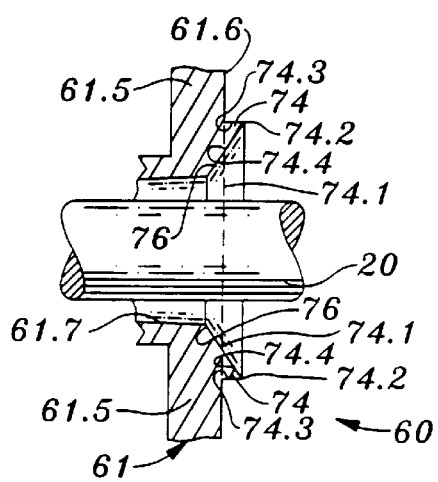

Referring again to FIG. 5, and comparing the same with FIGS. 5B and 6, it will be seen that a ridge 74 is raised on the inner surface of planar wall 61.5 of coil bobbin 61. Ridge 74 (like ridge 70.5 shown in FIG. 5A) is of toroidal configuration, and of generally triangular cross-section, considering ridge 74 to be bounded by the plane 74.1 of the inner face 61.6 of planar wall 61.5 of coil bobbin 61.

As best seen in FIG. 5B, the part of ridge 74 most remote from plane 74.1 is the peak 74.2 of ridge 74. It is to be particularly noted that peak 74.2 (like peak 70.3 shown in FIG. 5A) is a circular, linear (i.e., sharp) peak.

It is to be understood that in accordance with a principal feature of the present invention peak 74.2 is linear, in the sense that it has substantially no face area, but rather constitutes a sharp edge, whereby it serves to prevent migration of silicone damping fluid from inner face 61.6 of wall 61.5 to the interior of tapered passage 61.7.

It will also be understood by those having ordinary skill in the instrument art, informed by the present disclosure, that ridge 74 has a cylindrical outer surface 74.3, and a frustoconical inner surface 74.4, and that inner surface 74.4 lies in the same conical surface as the toroidal portion 76 of the inner face 61.6 of wall 61.5.

In view of the above, it will now be understood by those having ordinary skill in the instrument art, informed by the present disclosure, that in accordance with a principal feature of my present invention the movement of a moving magnet indicating instrument is provided with an outer damping fluid migration barrier, a particular embodiment 80 of which is shown in FIG. 6 (and in FIGS. 5 and 5B) and the main parts and aspects of which are designated respectively by the reference numerals 74, 74.2, 74.3, 74.4, etc. In accordance with another principal feature of my present invention, the movement of a moving magnet indicating instrument is provided with an inner damping fluid migration barrier, a particular embodiment 82 of which is shown in FIG. 7 (and in FIGS. 5 and 5A) and the main parts and aspects of which are designated by the reference numerals 70. 70.1, 70.2, 70.3, 70.5, etc.

In accordance with another principal feature of my present invention, the movement of a moving magnet indicating instrument is provided with a damping fluid migration barrier set 81, i.e., an outer migration barrier 80 and an inner migration barrier 82, as abovedescribed and shown in FIG. 5.

Referring now to FIG. 8, there is shown a moving magnet indicating instrument movement 100 of the second preferred embodiment of my present invention.

As will be understood by those having ordinary skill in the art, informed by the present disclosure, many structural aspects of movement 100 of FIG. 8 are substantially identical to the same structural aspects of the prior art movement 10 shown in FIGS. 1 through 4.

Thus, for clarity of disclosure, structural aspects common to prior art movement 10 and movement 100 of FIG. 8 will be identified by the reference numeral used to designate that structural aspect in FIGS. 1 through 4.

Further, the structural aspects of movement 100 of the second preferred embodiment of my present invention which are structurally substantially identical to corresponding structural aspects of movement 60 of the first preferred embodiment of my present invention, shown in FIGS. 5, 5A, 5B, 6 and 7, will be designated herein by the same reference numerals which are applied to the corresponding common parts in the description of the first preferred embodiment, and found in FIGS. 5, 5A, 5B, 6 and 7.

Thus, it will be seen by those having ordinary skill in the instrument art, informed by the present disclosure, that moving magnet indicating instrument 100 shown in FIG. 8 is comprised of a coil bobbin 61 which is substantially identical to the coil bobbin 61 of FIGS. 5, 5B and 6, which is provided on the inner face of its planar wall 61.5 with an outer damping fluid migration barrier 80 of the present invention which is substantially identical to the outer migration barrier 80 shown in FIG. 6.

As will further be understood by those having ordinary skill in the instrument art, informed by the present disclosure, shaft 20 of the second preferred embodiment of my present invention shown in FIG. 8 is substantially identical to shaft 20 of the first preferred embodiment of my present invention, which is substantially identical to shaft 20 of the prior art shown in FIGS. 1 through 4.

Referring again to FIG. 8, it will be seen that the rotor 102 of movement 100 of the second preferred embodiment of my present invention is of a novel kind, not shown in the earlier-numbered figures of the drawings, and which is a principal feature of my present invention. That is to say, rotor 102 (FIG. 8) is fabricated as a single piece of permanent magnet material, preferably the same kind of permanent magnet material from which toroidal permanent magnet member 64 (FIG. 5) is fabricated.

Thus, as seen in FIG. 8, rotor 102 is provided with a bore 102.1 which close-fittingly or tight-fittingly receives shaft 20. If required, a suitable adhesive bond may be provided between shaft 20 and the wall of bore 102.1, whereby rotor 102 is irrotatably affixed to shaft 20, without the interposition of a core or bushing.

As also seen in FIG. 8, rotor 102 is provided with an inner damping fluid migration barrier 104 which is substantially identical to inner migration barrier 82 of the first preferred embodiment of my present invention, shown in FIGS. 5, SA and 7, and an outer damping fluid migration barrier 106 which is substantially identical to outer migration barrier 70.5 of FIG. 5.

Summarizing, movement 100 of the second preferred embodiment of my present invention generally resembles movement 10 of the prior art, shown and described in connection with FIG. 1 through 5, except that it is provided with a unitary magnetic material rotor 102 as described hereinabove, and is further provided with a migration barrier set 108, i.e., migration barriers 104 and 106, which is itself a principal feature of my present invention.

Referring now to FIG. 9, there is shown a dual moving magnet indicating instrument movement 120 of the third preferred embodiment of my present invention.

For clarity of disclosure, structural aspects of movement 120 (FIG. 9) which are substantially identical to corresponding structural aspects of movements of the prior art shown in FIGS. 1 through 4 or movements of other embodiments of my present invention shown and described elsewhere herein, will be identified by the same reference numerals used to identify the corresponding structural aspects of those prior art movements or movements of other embodiments of my present invention.

Thus, the magnetic material rotors of the third preferred embodiment of my present invention (FIG. 9) will sometimes hereinafter be designated by the reference numeral 64, primed and doubly primed, respectively, to distinguish between the front rotor 64' and the rear rotor 64".

It will be understood, then, by those having ordinary skill in the instrument art, informed by the present disclosure, that rotor 64' and rotor 64" are both substantially identical to rotor 64 (FIG. 5).

It will also be understood that rotor core 66 shown in FIG. 9 is substantially identical to core rotor 66, shown in FIG. 5 and described hereinabove in connection therewith.

As further seen in FIG. 9, dual moving magnet indicating instrument movement 120 of the third preferred embodiment of my present invention is comprised of two pointers 122, 124, sometimes called, respectively, the "front pointer" (122) and the "rear pointer" (124) herein.

In the third preferred embodiment (FIG. 9) both of the pointers 122, 124 cooperate with a single dial face (not shown) which is provided with two graduated scales one of which cooperates with dial pointer 122 and the other one of which cooperates with dial pointer 124. In this embodiment the two dials are of different radius, and the two dial pointers are of different length, each pointer being of a length substantially equal to the radius of the cooperating dial. In other embodiments the scales of the dial face may be superimposed, or a single scale may coact with the two pointers.

Thus, in certain preferred embodiments pointers 122 and 124 may be of different, contrasting colors, the respective dials being of the same color as their respective associated dial pointers, in which case the two dials may be of substantially the same radius, or may be of different radius.

As also seen in FIG. 9, dual-pointer movement 120 is comprised of two coil bobbins 126, 128; bobbin 126 containing rotor 64' and bobbin 128 containing rotor 64".

Bobbins 126 and 128 both have many structural features in common with the bobbins of the above-described movements 10, 60 and 100, but differ therefrom in particular structural features. Only said particular structural features of movement 120 will be described in the following discussion of movement 120.

Referring again to FIG. 9, it will be seen by those having ordinary skill in the instrument art, informed by the present disclosure, that outer pointer 122 is mechanically connected to rotor 64" contained in rear bobbin 128 by means of inner (solid) shaft 130 for joint rotation with rotor 64", and that pointer 124 is mechanically connected to rotor 64' contained in front bobbin 126 by means of outer (hollow) shaft 132 for joint rotation with rotor 64'.

In other words, every angular movement of rotor 64" is exactly duplicated by a corresponding angular movement of pointer 122; and every angular movement of rotor 64' is exactly duplicated by a corresponding angular movement of pointer 124.

Thus, it will be understood that inner shaft 130 is affixed to pointer 122, passes freely and loosely through hollow shaft 132, is journaled in boss 126.1 of coil bobbin 126, passes freely through oversize passage 128.6 in coil bobbin 128, is affixed to core 66 of rotor 64", and is journaled in boss 128.1 of coil bobbin 128.

It will also be understood that outer shaft 132 is affixed to inner pointer 124, is journaled in nose 126.2 of coil bobbin 126, is fixed in the axial passage extending through the core 134 of rotor 64', and is journaled in a passage in the rear planar wall 126.3 of coil bobbin 126, and in the rotor positioning boss 126.4 which projects inwardly from wall 126.3 and is a principal feature of the present invention.

Referring now to coil bobbin 126 shown in FIG. 9, it will be seen by those having ordinary skill in the instrument art, informed by the present disclosure, that each planar wall 126.3, 126.6 of coil bobbin 126 is provided on its inner face with a rotor positioning boss 126.4, 126.5 and a surrounding migration barrier ridge 126.7, 126.8 of the present invention.

As will be understood by those having ordinary skill in the instrument art, informed by the present disclosure, each migration barrier ridge 126.7, 126.8 is similar in structure and function to migration barrier ridge 74 (FIG. 5B), and is a principal feature of the present invention.

As also seen in FIG. 9, core 134 is comparable in structure and function to core 66 of FIG. 5, with the exception that core 134 is double-ended, i.e., has a boss 134.1, 134.2 at each end thereof. Each boss 134.1, 134.2 is similar in structure and function to boss 68 (FIG. 5), and is a principal feature of my present invention.

As further seen in FIG. 9, each boss 134.1, 134.2 has a planar inner surface 134.3, 134.4, respectively, each of which planar inner surfaces is perpendicular to shafts 130, 132, is a principal feature of my present invention, and is substantially the same in structure and function as face 70.1 of FIG. 5.

In accordance with a principal feature of my present invention, each planar inner face 134.3, 134.4 is in confronting relationship to the outer end of a corresponding one of the rotor positioning bosses 126.4, 126.5, but is normally spaced therefrom. Thus, planar faces 134.3, 134.4 will sometimes hereinafter be called "stop faces".

As will be seen by those having ordinary skill in the instrument art, informed by the present disclosure, rotor positioning bosses 126.4, 126.5 cooperate with stop faces 134.3, 134.4 to maintain rotor 64' centered between the walls 126.3, 126.6 of coil bobbin 126, in accordance with a principal feature of my present invention.

Also, in accordance with another principal feature of my present invention, each boss 134.1, 134.2 is provided with a migration barrier ridge 134.5, 134.6, each of which ridges is similar in structure and function to ridge 74 (FIG. 5A).

Returning again to FIG. 9, it will be seen that the outer end of boss 126.1 is received in a cavity 128.2 formed in boss 128.3 of coil bobbin 128. Boss 126.1 is fixed in cavity 128.2, and thus coil bobbins 126 and 128 form a single unit and are irrotatable with respect to each other. Each coil bobbin is provided with a measured quantity of damping fluid 32 in the manner described hereinabove.

In accordance with a principal feature of my present invention, coil bobbin 128 is provided with migration barrier ridge 128.4. Further, core 66 is provided with a migration barrier ridge 70.5, as described hereinabove in connection with FIG. 5A, and a rotor positioning boss 128.5 is provided.

Figure 10:
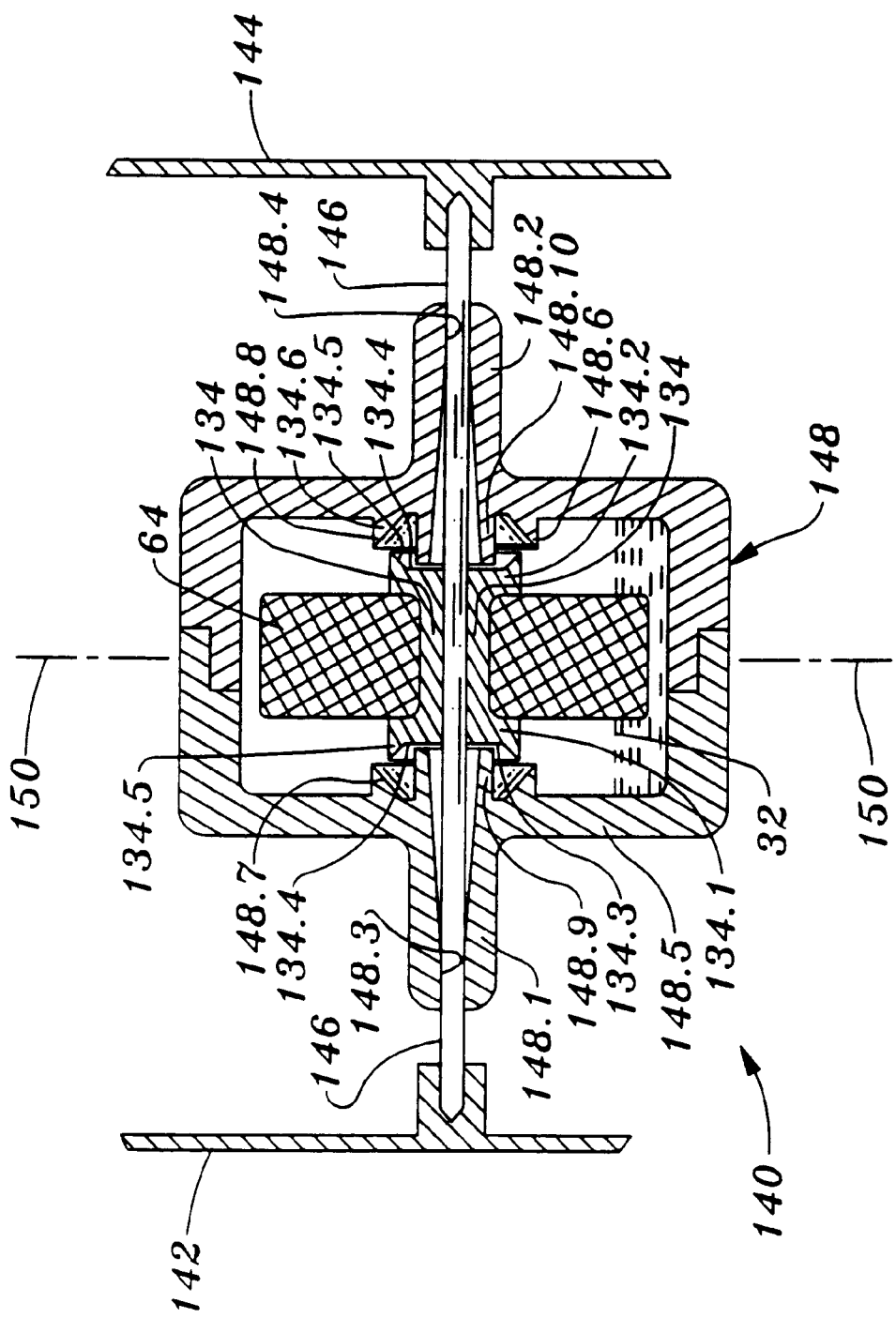
FIG. 10 is a cross-sectional view of a moving magnet indicating instrument of my present invention in which the pointer shaft bears two pointers, which pointers confront opposite faces of the housing of said moving magnet indicating instrument.

Referring now to FIG. 10, there is shown a dual-pointer movement 140 of the fourth preferred embodiment of my present invention.

As seen in FIG. 10, movement 140 is provided, in accordance with the teachings of my present invention, with two pointers 142, 144, located at opposite ends of a common pointer shaft 146.

In accordance with the teachings of my present invention movement 140 is contained within an instrument housing (not shown) which is provided with two dial faces, which dial faces are preferably located on opposed faces of the housing, each face bearing an indicating scale. Each pointer 142, 144 is so juxtaposed to its associated dial face that the outer portion of each pointer sweeps from end to end of its associated scale (inscribed or otherwise reproduced on the associated dial face) when rotor 64 (FIG. 10) is rotated through its maximum angular deflection by the field produced by the current flowing through the wires (not shown) wound on coil bobbin 148 (FIG. 10).

Thus, it will be understood by those having ordinary skill in the instrument art, informed by the present disclosure, that movement 140 of the fourth preferred embodiment of my present invention is adapted to be contained in an instrument which has a dial on each one of two opposed faces thereof (sometimes called the "front face" and the "back face").

The same practice is adopted with respect to FIG. 10 as is adopted with respect to certain previous figures of the drawings, viz., that structural aspects designated in FIG. 10 by reference numerals of particular numerical value, less than 140, refer to structural aspects shown in previous figures of the drawings and described hereinabove in connection therewith.

Referring again to FIG. 10, it will be seen by those having ordinary skill in the instrument art, informed by the present disclosure, that pointer 142 is irrotatably affixed to one end of common shaft 146, and that pointer 144 is irrotatably affixed to the other end of common shaft 146.

Core 134 (FIG. 10) is substantially identical in structure to core 134 shown in FIG. 9 and described hereinabove in connection herewith.

It is also to be understood that rotor 64 is fixed to core 134, and thus that rotor 64 cannot be rotated about the axis of core 134 unless core 134 is correspondingly rotated about its own axis.

As also seen in FIG. 10, coil bobbin 148 is generally mirror-symmetric about plane 150, each mirror image half generally resembling the left-hand shell of coil bobbin 126 as shown in FIG. 9, but the mating parts differing from each other in such a way that the two shells can be fluid-tightly sealed together in the same manner in which the two shells of coil bobbin 126 (FIG. 9) are fastened together.

Thus, it will be understood by those having ordinary skill in the instrument art, informed by the present disclosure, that coil bobbin 148 is provided with two oppositely directed, substantially identical projections or "noses" 148.1, 148.2 which have respective central passages 148.3, 148.4. The axes of passages 148.3, 148.4 are coaxial. Further, it will be seen that common shaft 146 is journaled in both of the passages 148.3, 148.4.

As further seen in FIG. 10, the inner face of each planar wall 148.5, 148.6 of bobbin 148 is provided with a migration barrier ridge 148.7, 148.8, which ridges are principal features of my present invention.

Also provided on each of said inner faces of the respective planar walls 148.5, 148.6 is a rotor positioning boss 148.9, 148.10. Rotor positioning bosses 148.9, 148.10 are both substantially identical to rotor positioning boss 126.5 (FIG. 9) in structure and function.

Both outer ends of core 134 (FIG. 10) are substantially identical to the outer ends of the core 134 shown in FIG. 9, and thus it will be seen that each end of core 134 (FIG. 10) is provided with a migration barrier ridge 134.1, 134.2. Each end of core 134 is provided with a flat inner surface 134.4, 134.5. Each such flat inner surface 134.4, 134.5 cooperates with its associated rotor positioning boss (148.9, 148.10) in the same way in which flat inner surface 134.3 (FIG. 9) cooperates with rotor positioning boss 126.5 (FIG. 9).

In the known manner, a body of damping fluid 32 is provided in the chamber defined by bobbin 148.

While several particular principal features of my present invention have been shown and described hereinabove, and in the accompanying drawings, other combinations of particular ones of those features also constitute inventive combinations and are believed to be claimed by one or more of the claims appended hereto.

Figure 11:
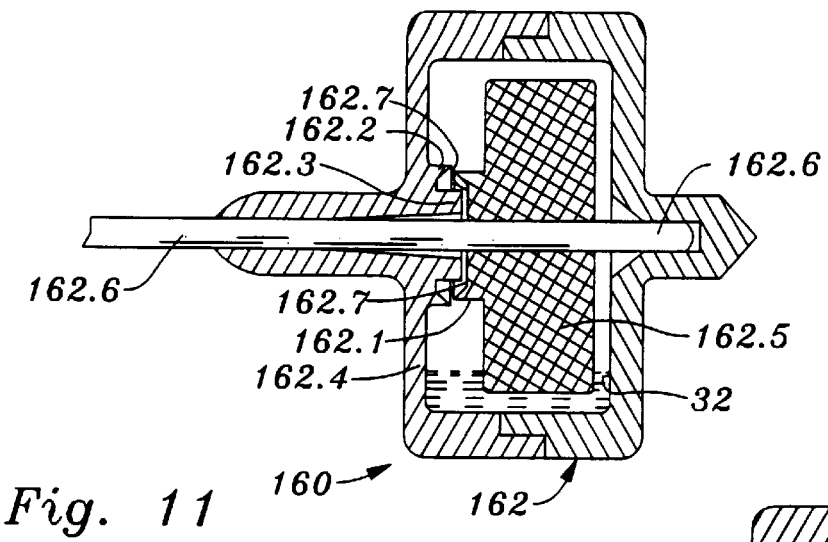
FIGS. 11 through 13 are cross-sectional views of the moving magnet indicating instruments of further alternative embodiments of my present invention.

Referring now to FIG. 11, in which is shown the fifth preferred embodiment of my present invention, there is shown a movement 160 which in itself constitutes a principal feature of my present invention. As seen in FIG. 11, movement 160 is comprised of a coil bobbin 162 which in its external aspects is substantially identical to coil bobbin 61 of FIGS. 5, 5B, 6 and 8.

In movement 160, however, the interior surface of planar wall 162.1 is configured like the interior surface of planar bobbin wall 148.5 of bobbin 148 of movement 140 (FIG. 10).

That is to say, the interior surface of planar wall 162.1 of bobbin 162 of movement 160 is provided with a migration barrier ridge 162.2 which corresponds in structure and function to migration barrier ridge 148.7 of bobbin 148 of movement 140 (FIG. 10), and is also provided with a rotor positioning boss 162.3 which corresponds in structure and function to rotor positioning boss 148.9 of bobbin 148 of movement 140 (FIG. 10).

Also, the boss 162.4 of rotor (magnet) 162.5 (FIG. 11) is of substantially the same configuration as that of boss 134.1 of magnet-core assembly 64'–134 of movement 120 (FIG. 9), but at the same time boss 162.4 is integral with the main body of rotor (magnet) 162.5, whereas boss 134.1 (FIG. 9) is part of the separate core 134 of the rotor 64' of movement 120 of FIG. 9.

As also will be understood by those having ordinary skill in the instrument art, informed by the present disclosure, pointer shaft 162.6 is substantially identical to pointer shaft 20 of the prior art (FIG. 2), except that it is not provided with a shoulder of the kind typified by shoulder 38.1 of shaft 20 shown in FIG. 2.

Thus, the corresponding shoulder 38 (in nose 12.3 of bobbin 12, FIG. 2), is not needed in movement 160 of the fifth preferred embodiment of the present invention (FIG. 11), because the outward (leftward in FIG. 11) limit of axial movement of rotor 162.5 is determined by contact between rotor positioning boss 162.3 and planar central face 162.7 of the boss 162.4 of rotor 162.5, all of which are principal features of my present invention.

Figure 12:
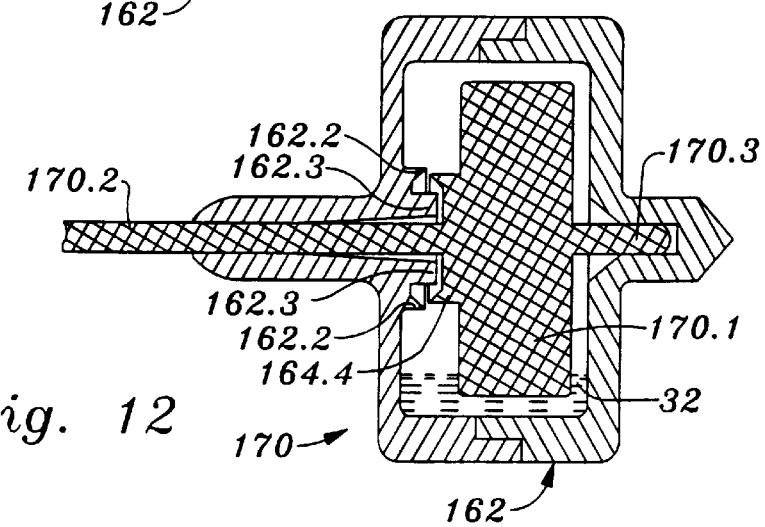

Referring now to FIG. 12, there is shown a movement 170 of the sixth preferred embodiment of my present invention.

As best seen by comparison of FIGS. 11 and 12, coil bobbin 162 of movement 170 is substantially identical to coil bobbin 162 of movement 160 of the fifth preferred embodiment, including migration barrier ridge 162.2 and rotor positioning boss 162.3, both of which are principal features of my present invention.

As further seen by comparison of FIGS. 11 and 12, rotor 170.1 is of substantially the same configuration as rotor 162.5 of the fifth preferred embodiment (FIG. 11), including the provision of boss 162.4, except for the fact that, in accordance with a principal feature of my present invention, the separate pointer shaft 162.6 of the fifth preferred embodiment is replaced by two integral projections 170.2, 170.3 which are integral with rotor 170.1 and fabricated from the same magnetic material as that of rotor 170.1, at the same time.

Thus, it will be understood by those having ordinary skill in the instrument art, informed by the present disclosure, that fabrication of the rotor shaft equivalent, i.e., projections 170.2 and 170.3, of the sixth preferred embodiment at the same time and from the same material as that of the rotor body is a principal feature of my present invention.

Figure 13:
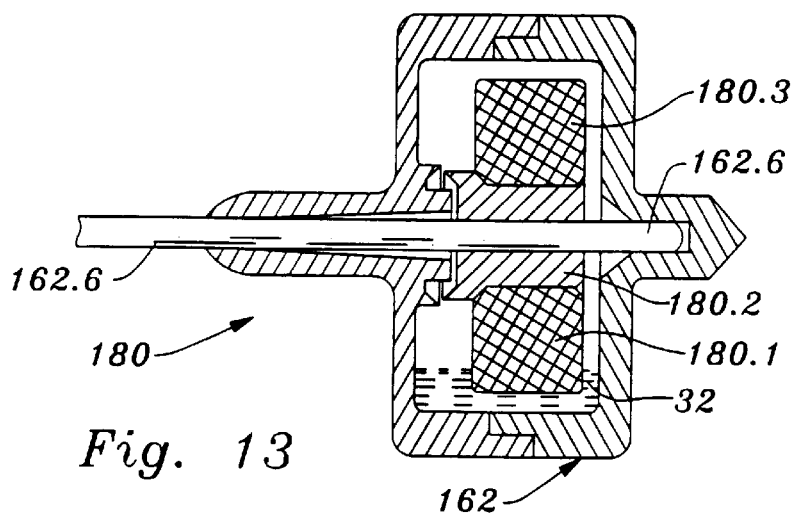

Referring now to FIG. 13, there is shown a movement 180 of the seventh preferred embodiment of my present invention.

As may be seen by comparison of FIGS. 11 and 13, movement 180 is substantially identical to movement 160 of the fifth preferred embodiment (FIG. 11) with the exception that the core or bushing (180.2) of rotor 180.1 is fabricated from a material different from the magnetic material of the main rotor body 180.3, and this exception is a principal feature of my present invention.

It will thus be seen by those having ordinary skill in the instrument art, informed by the present disclosure, that by the various aspects of the present invention described hereinabove it is made possible to avoid the use of conventional, very small shaft positioning maintaining shoulders 38, 38.1 (FIG. 2) and yet to limit the longitudinal travel of rotor 18, and at the same time to avoid the molding of outwardly projecting, delicate stop means on a plane face of the rotor.

Figure 14:
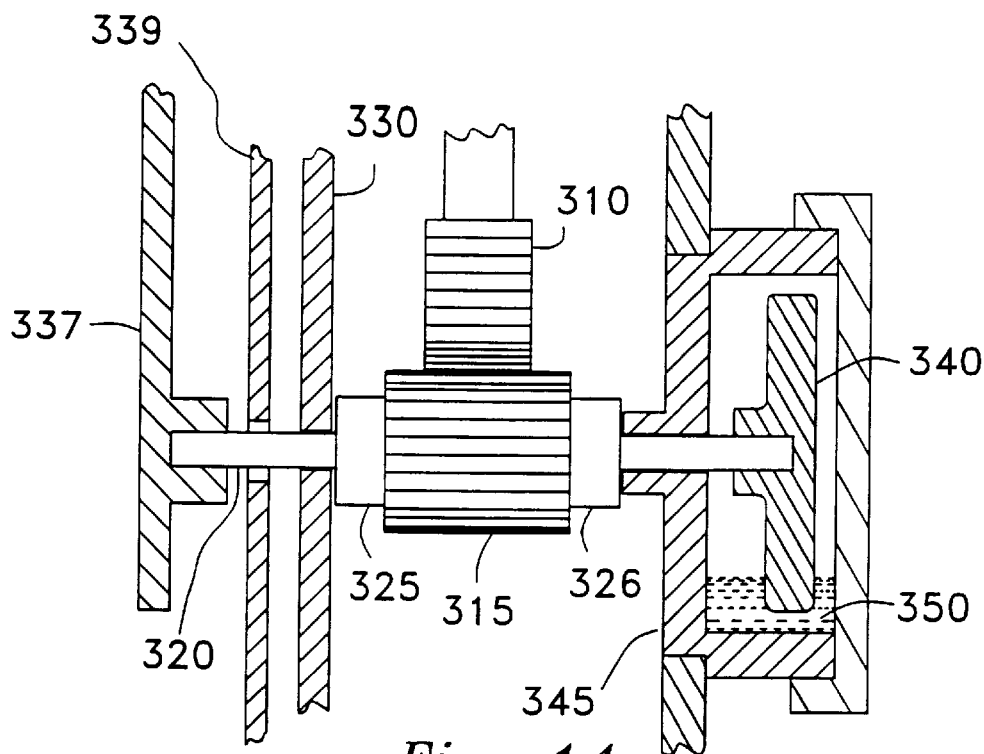
FIG. 14 is a cross-sectional view of a prior-art Bourdon tube indicating instrument.

The migration barriers of the present invention can also be employed in mechanical indicating instruments. For example, they can be used with a Bourdon tube pressure gauge. A Bourdon tube is a hollow, curved tube with one closed end and one open end. The open end connects to a pressurized cavity. The pressure in the cavity causes the curved tube to straighten an amount proportional to the pressure. FIG. 14 illustrates a portion of a prior art Bourdon tube pressure gauge.

Sector gear 310 is coupled to the Bourdon tube (not shown) such that sector gear 310 moves an amount proportional to the deformation of the Bourdon tube, which, itself, is proportional to the pressure in the cavity being tested. Sector gear 310 engages pinion 315, which is coupled to a shaft 320 and associated sleeves 325 and 326. In the manner previously described, shaft 320 is connected to a pointer 337, which is juxtaposed against a dial 339 to indicate the pressure in the cavity being tested. Shaft 320 is connected to a rotatable element 340, which is loosely received by a cavity defined by housing 345. The cavity is partially filled with a viscous fluid 350, which damps the rotational movement of rotational element 340 and, in turn, shaft 320 and pinion 315.

One of the main problems with the prior art arrangement shown in FIG. 14 is that fluid 350 tends to migrate over the surface of rotatable element 340, shaft 320, and housing 345. This can cause the fluid to leak out of the cavity defined by housing 345 through the space between housing 345 and shaft 320. In addition, if the instrument is placed with pointer 337 downwards (e.g., during shipping), fluid can leak out of the cavity. Fluid that leaks through the space between housing 345 and shaft 320 can migrate into other areas of the instrument, causing malfunction and/or aesthetic problems.

Figure 15:
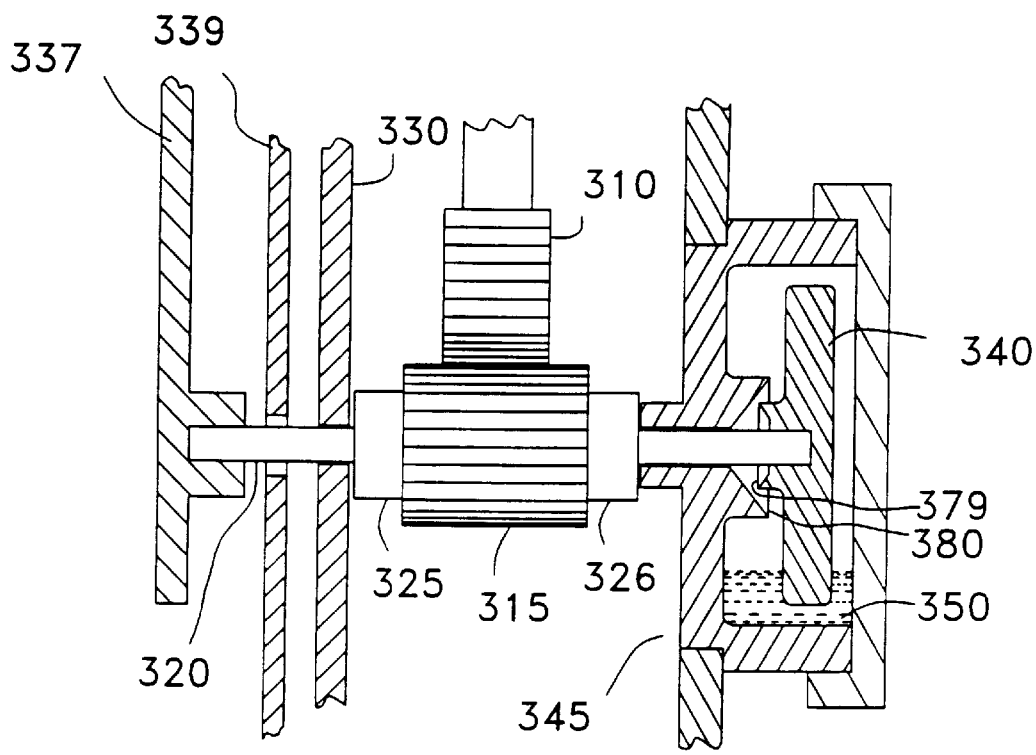
FIG. 15 is a cross-sectional view of a Bourdon tube indicating instrument employing the migration barriers of the present invention.

The Bourdon tube pressure gauge of the present invention shown in FIG. 15 overcomes this problem with migration barriers. The gauge of FIG. 15 operates in the same manner as the prior art gauge of FIG. 14 except that migration barriers 379 and 380 are provided on rotor 340 and housing 345, respectively. Migration barrier 379 is preferably constructed as a toroidal ridge, integral with rotor 340 and having substantially no surface area at its sharp peak. Similarly, migration barrier 380 is preferably constructed as an integral part of housing 345, again comprising a toroidal ridge having substantially no surface area at its sharp peak. As previously discussed, the sharp peaks of migration barriers 379 and 380 impede the migration of fluid 350 onto other parts of the instrument by providing no surface area over which the fluid 350 can "creep."

As is evident by FIGS. 14 and 15, the migration barriers of the present invention are not limited to moving magnet indicating instruments. They can be employed with any indicating instruments, including mechanical instruments such as Bourdon tube arrangements. Moreover, the migration barriers of the present invention are useful outside the indicating instrument art. Indeed, the migration barriers of the present invention can be employed in any application wherein it is desired to keep fluid having a tendency to migrate over a surface from migrating into areas outside a specified chamber.

In addition, it will be recognized by those skilled in the art that the present invention is not limited to the particular configuration of migration barriers shown in the drawings. For example, when used in an indicating instrument as disclosed above, instead of, or in addition to, providing a migration barrier on the rotor, a migration barrier sleeve may be provided as a toroidal ridge on the rotor shaft. Moreover, the angle between the base of the migration barrier and the surface from which it arises may be varied from that shown without departing from the spirit and scope of the present invention. Also, the acute angle created by the sharp peak of the migration barrier can be varied, though it is preferred that the angle be less than 50 degrees.

Figure 16:
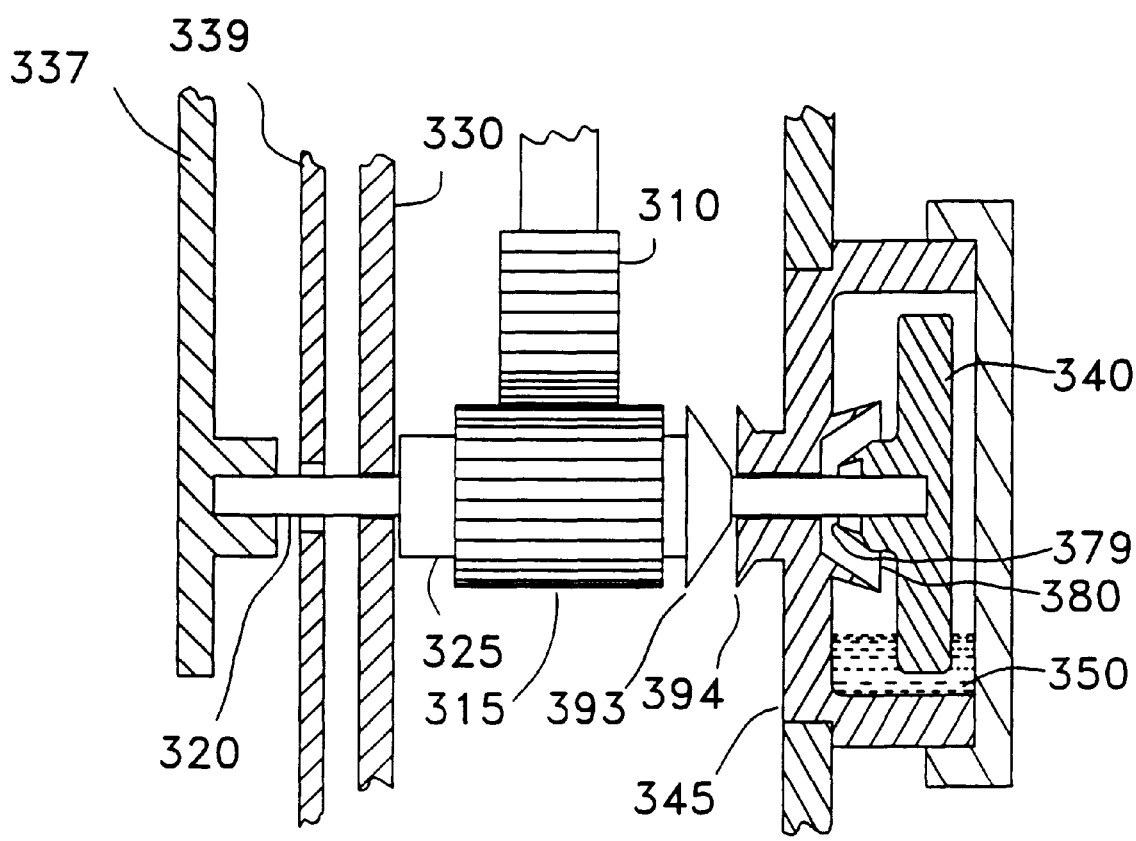
FIG. 16 is a cross-sectional view of an alternative embodiment of a Bourdon tube indicating instrument employing the migration barriers of the present invention.

FIG. 16 is illustrative of the flexibility of design provided by the present invention. FIG. 16 is identical to FIG. 15 except that the angles and placement of migration barriers 379 and 380 have been changed and two new migration barriers 393, 394 have been added outside the chamber defined by housing 345. Migration barrier sleeve 393 preferably replaces shaft-sleeve 326 from FIG. 15, but may be provided as a separate element attached to shaft-sleeve 326. In either event, migration barrier sleeve 393 is attached to and turns with shaft 320. Migration barrier 394 is preferably provided as an integral part of housing 345. Migration barriers 393 and 394 provide an additional impediment against unwanted migration of fluid 350 along shaft 320. Any fluid that might escape past barriers 379 and 380 should be trapped between migration barriers 393 and 394, unable to migrate over their sharp peaks.

Thus, it should be apparent to those skilled in the art that the migration barriers of the present invention can be employed in a variety of applications, including mechanical indicating instruments. It should also be readily apparent that the migration barriers of the present invention can be employed in mechanical versions of the dual pointer embodiments shown in FIGS. 9 and 10.

It will thus be seen that the objects set forth above, among those made apparent from the preceding description, are efficiently attained, and since certain changes may be made in the above constructions without departing from the scope of my present invention, it is intended that all matter contained in the above description or shown in the accompanying drawings shall be interpreted as illustrative only, and not in a limiting sense.

It is also to be understood that the following claims are intended to cover all of the generic and specific features of my present invention hereindescribed, and all statements of the scope of my present invention which, as a matter of language, might be said to fall therebetween.

What is claimed is:

1. A fluid migration barrier system for preventing the migration of a fluid out of a chamber, comprising:
   a housing defining a chamber, wherein the chamber has at least a first opening defined by a first perimeter edge of the housing and a closed end substantially opposite the first opening, and wherein an axis is defined between the center of the first opening and the center of the closed end;
   a fluid disposed in the chamber;
   a first ridge on the housing surrounding the axis of the chamber;
   wherein the first ridge forms a first sharp edge, thereby discouraging the fluid in the chamber from migrating over the surface of the housing beyond the first ridge.

2. The fluid migration barrier system of claim 1, further comprising a rotatable element disposed in the chamber.

3. The fluid migration barrier system of claim 1, wherein the first ridge projects into the chamber.

4. The fluid migration barrier system of claim 1, wherein the first ridge projects out of the chamber.

5. The fluid migration barrier system of claim 1, wherein the first ridge is integral with the first perimeter edge.

6. The fluid migration barrier system of claim 1, wherein the first ridge forms the first perimeter edge.

7. The fluid migration barrier system of claim 1, further comprising:
   a rotor adapted to rotate within the chamber and having an axis of rotation that is concentric with the chamber, wherein the rotation of the rotor within the chamber is damped by the presence of the fluid in the chamber.

8. The fluid migration barrier system of claim 7, further comprising:
   a second ridge on the rotor surrounding the axis of rotation of the rotor;
   wherein the second ridge creates a second sharp edge, thereby discouraging the fluid in the chamber from migrating over the surface of the rotor beyond the second raised ridge.

9. The fluid migration barrier system of claim 7, further comprising:
   a shaft, concentric with and attached to the rotor;
   a second ridge on the shaft surrounding the axis of rotation of the shaft;
   wherein the second ridge creates a second sharp edge, thereby discouraging the fluid in the chamber from migrating over the surface of the shaft beyond the second raised ridge.

10. An indicating instrument, comprising:
    a housing defining a chamber having at least a first opening;
    a fluid disposed in the chamber;
    a rotatable element having an axis of rotation and rotatably mounted in the chamber;
    a shaft, concentric with and attached to the rotatable element and extending through at least the first opening; and
    a first fluid migration barrier on the housing surrounding the axis of rotation of the rotatable element and discouraging the migration of the fluid over the surface of the housing beyond the first fluid migration barrier.

11. The indicating instrument of claim 10, further comprising:
    a second fluid migration barrier on the rotatable element surrounding the axis of rotation of the rotatable element and discouraging the migration of the fluid over the surface of the rotatable element beyond the second fluid migration barrier.

12. The indicating instrument of claim 10, wherein the first fluid migration barrier is a ridge having a sharp edge.

13. The indicating instrument of claim 10, wherein the shaft is integral with the rotatable element.

14. The indicating instrument of claim 10, wherein the rotatable element is comprised of a magnetic material and the rotation of the rotatable element and shaft are controlled by a magnetic field environing the rotatable element.

15. The indicating instrument of claim 10, further comprising a Bourdon tube, operatively connected to the shaft and controlling the rotation of the rotatable element and shaft.

16. The indicating instrument of claim 10, further comprising:
    a second fluid migration barrier on the shaft surrounding the axis of rotation of the shaft and discouraging the migration of the fluid over the surface of the shaft beyond the second fluid migration barrier.

17. An indicating instrument, comprising:
    a housing defining a chamber having at least a first opening;
    a fluid disposed in the chamber;

a rotatable element having an axis of rotation and rotatably mounted in the chamber;

a shaft, concentric with and attached to the rotatable element, extending through at least the first opening; and a first fluid migration barrier on the rotatable element surrounding the axis of rotation of the rotatable element and discouraging the migration of the fluid over the surface of the rotatable element beyond the first fluid migration barrier.

18. The indicating instrument of claim 17, wherein the first fluid migration barrier is a ridge having a sharp edge.

19. The indicating instrument of claim 17, wherein the shaft is integral with the rotor.

20. The indicating instrument of claim 17, wherein the rotatable element is comprised of a magnetic material and the rotation of the rotatable element and shaft are controlled by a magnetic field environing the rotatable element.

21. The indicating instrument of claim 17, further comprising a Bourdon tube, operatively connected to the shaft and controlling the rotation of the rotatable element and shaft.

* * * * *